United States Patent [19]
Autryve

[11] Patent Number: 5,935,877
[45] Date of Patent: Aug. 10, 1999

[54] ETCH PROCESS FOR FORMING CONTACTS OVER TITANIUM SILICIDE

[75] Inventor: Luc Van Autryve, St. Cloud, France

[73] Assignee: Applied Materials, Inc., Santa Clara, Calif.

[21] Appl. No.: 08/522,791

[22] Filed: Sep. 1, 1995

[51] Int. Cl.[6] .................................................. H01L 21/00
[52] U.S. Cl. ........................ 438/743; 438/714; 438/738
[58] Field of Search ........................... 156/643.1, 646.1, 156/657.1; 438/714, 723, 738, 743

[56] References Cited

U.S. PATENT DOCUMENTS

| | | | |
|---|---|---|---|
| 4,615,764 | 10/1986 | Bobbio et al. ............................ | 438/723 |
| 4,668,338 | 5/1987 | Maydan et al. ....................... | 156/643.1 |
| 4,711,698 | 12/1987 | Douglas ................................ | 156/646.1 |
| 4,734,157 | 3/1988 | Carbaugh et al. .................... | 156/646.1 |
| 4,753,709 | 6/1988 | Welch et al. .......................... | 156/643.1 |
| 4,863,559 | 9/1989 | Douglas ................................ | 156/643.1 |
| 4,957,590 | 9/1990 | Douglas ................................ | 156/643.1 |
| 5,100,505 | 3/1992 | Cathey et al. ......................... | 156/646.1 |
| 5,176,790 | 1/1993 | Arleo et al. ........................... | 156/657.1 |
| 5,254,213 | 10/1993 | Tamaki .................................... | 156/655 |
| 5,269,879 | 12/1993 | Rhoades et al. ..................... | 156/646.1 |
| 5,284,549 | 2/1994 | Barnes et al. ......................... | 156/643.1 |
| 5,468,296 | 11/1995 | Patrick et al. .................... | 118/723 MP |
| 5,468,339 | 11/1995 | Gupta et al. .............................. | 216/67 |
| 5,468,340 | 11/1995 | Gupta et al. .............................. | 216/79 |
| 5,468,342 | 11/1995 | Nulty et al. ............................... | 216/75 |
| 5,604,601 | 2/1997 | Kawasaki .............................. | 156/643.1 |
| 5,662,772 | 9/1997 | Scheiter et al. ............................. | 216/2 |

*Primary Examiner*—R. Bruce Breneman
*Assistant Examiner*—Anita Alanko
*Attorney, Agent, or Firm*—Patricia Coleman James

[57] ABSTRACT

A plasma etch process for an insulating layer, such as silicon dioxide, overlaying a silicide layer having a high selectivity with respect to the silicide layer is disclosed, comprising the use of a mixture of a nitrogen-containing gas and one or more other fluorine-containing etch gases in an etch chamber maintained within a pressure range of from about 5 millitorr to about 400 millitorr. The high selectivity exhibited by the etch process of the invention permits operation of the etch process at reduced pressures of from as low as 5 millitorr to about 30 millitorr to achieve complete etching of vertical sidewall openings in the oxide layer with significant overetch capability.

33 Claims, 8 Drawing Sheets

25.0 kV X 30.0 K 1.00μm 25.0 kV X 30.0 K 1.00μm

ETCH PROCESS FOR FORMING CONTACTS OVER TITANIUM SILICIDE

BACKGROUND OF THE INVENTION

1. Technical Field of the Invention

The present invention relates to a method for forming contact openings in an integrated circuit structure by plasma etching the insulating layer using a mixture of one or more fluorine containing gases and a nitrogenous gas. More particularly, the present invention relates to a high selectivity plasma etch process for preferentially etching insulating material with respect to a silicide, in an integrated circuit structure, using a mixture of a nitrogen containing gas and one or more fluorine containing etchant gases.

2. Description of the Related Art

With the increasing push of technology for higher density integrated circuits, low resistivity interconnection paths are critical to the fabrication of dense, high performance devices. In MOS devices, for example, one approach to reduced resistivity delay and increased switching speeds is the use of polycide and salicide structures, shown in FIGS. 1a and 1b.

Referring to FIG. 1a, a polycide structure 10 is a low resistivity multilayer structure that includes a refractory metal silicide 12 formed on a polysilicon layer 14 overlying a gate oxide 16 formed between source/drain regions 17 of a silicon gate MOSFET. Contact structures 20, 22 appear as vertical openings in insulation layer 24. The openings, when filled with a conducting material 26, such as aluminum or an aluminum alloy, electrically connect devices on one level of an integrated circuit.

Referring to FIG. 1b, a salicide or self-aligned gate structure 30 is often used to reduce sheet resistivity of shallow junctions of source/drain regions while simultaneously reducing the interconnect resistance of polysilicon lines. In this structure, a refractory metal silicide 32 is deposited both over polysilicon 34 and the underlying gate oxide 36 and between silicon dioxide spacers 38 which act as ion implantation masks for the source) drain regions 39. Contact structures 40, 42 appear as vertical openings formed in insulation layer 44. These openings may also be filled with metal 46 to electrically connect devices on one level of an integrated circuit.

Conventionally, contact openings are formed by etching through an insulation layer, such as oxide, nitride or oxynitride. These insulating layers typically overlay silicon of silicon-containing surfaces, e.g., single crystal silicon such as a silicon wafer, epitaxial silicon, polysilicon, or suicides such as titanium silicide in integrated circuit structures. To ensure formation of desired dimensions and profile for contact openings, the etchant must be highly selective to promote removal of the insulation layer and not the underlying layer, the top surface of which desirably defines the end of the contact, i.e., the "contact stop." Contact stop layers 25 (FIG. 1a), and 45 (FIG. 1b) are sometimes used to help define the lower boundary of a contact opening. These stop layers are commonly composed of metal alloys, such as titanium-tungsten.

To ensure complete removal of the thickest portion of the layer to be etched and to allow for the etchant to break through any slow etching layers, it is often necessary to plan some degree of "overetch" into the process. However, "punch through," whereby the etchant species fails to sufficiently select or discriminate between the insulation layer and the contact stop, can become a significant problem when overetching. As a result, the etch rate does not slow down upon reaching the underlying stop layer and, therefore, the stop layer may be left undesirably thin or even completely etched through. Such an attack by the etchant species alters the dimensions of the contact opening, the resistivity of the interconnection and, in a MOS device, the device switching speed.

FIG. 2 presents a SEM photograph of punch through of a titanium silicide layer following a $CHF_3/CF_4$ etch through an oxide insulator. The low selectivity of this recipe to the titanium silicide renders this layered configuration ineffective in a MOS device. While such a low selectivity may be satisfactory for a highly planarized structure and for perfectly uniform etch/plasma chamber conditions, it is unacceptable in those applications where it is highly desirable to etch as little metal silicide as possible once such silicide is exposed during the etching of the overlying oxide. For example, it is desirable in some applications (e.g., MOS devices) to etch less than about 50 angstroms ($5 \times 10^{-3}$ μm) of underlying silicide during the oxide etch.

Loss in device yield due to punch through may be accepted as an inevitable part of semiconductor fabrication. Alternatively, it may be desirable to supplement the thickness of the contact stop to compensate for punch through. For example, additional thickness may be added to a thinned titanium silicide layer by annealing an exposed silicon layer in the presence of titanium. Taking such a step not only detracts from fabrication throughput, but may also lead to variations in contact resistance in a device and across wafers and within a wafer lot. Hence, it would be advantageous to avoid such an annealing step.

U.S. Pat. No. 5,176,790, assigned to the assignee of the present invention, is directed to an improved process for etching vias through an insulation layer to provide multilevel inter-connection on an integrated circuit structure. Typically, vias are to be etched in a photoresist-masked silicon oxide layer that overlies an electrically conductive metal layer (such as aluminum, alloys or mixtures of aluminum/silicon and titanium/tungsten). In order to prevent deposition of organometallic residues or backsputtered metal in the via, the '790 patent proposes the addition of a nitrogen-containing gas (such as $N_2$, NO, $N_2H_4$) to the fluorocarbon etchant in a volume ratio of 1:15 to 1:2.

U.S. Pat. Nos. 5,254,213 and 5,269,879 also disclose the addition of a nitrogen-containing gas to fluorine-based etching chemistries used in the formation of vias between metal layers. In each case the nitrogenous gas passivates the electrically conducting metallic layers by forming nitrides which prevent sputtering or redeposition of the metallic layers onto the sidewalls of the vias.

While the above-referenced patents disclose improved etching processes and recipes for particular etch environments, it must be recognized that etching is a localized phenomenon. That is, selective etching depends on heterogeneous interactions of the gas phase species with the solid surface to be etched as well as minimal interactions at the underlying surfaces to avoid etching these underlying surfaces. As such, design and improvement of etching processes require careful consideration of many factors, including: the physical-chemical properties of the etchant under the selected process parameters,; the nature of the material to be etched; etch rate and selectivity of the etchant with respect to other materials subject to exposure to the etchant; and the ability of the etch mechanism to produce desired profiles. The precise effect of changing one or more parameters of a given etch process is neither well understood nor predictable. Hence, one of ordinary skill in the art will appreciate that what is known about specific etching processes may not be at all predictive of or applicable to what may be required in the formation of contact openings in insulating layer/silicide substrate layer configurations.

It would, therefore, be desirable to provide an insulating layer etch process which would exhibit high selectivity to silicides without any substantial reduction in the etch rate of the insulating material.

SUMMARY OF THE INVENTION

The present invention overcomes the above-discussed problems by providing an improved etch process for selectively forming contact openings in an insulation layer formed on a silicide layer. The insulating layer etch process of the invention comprises the plasma etching of an insulating material, such as silicon oxide, over a metallic silicide surface using a mixture of one or more fluorine-containing etchant gases and a nitrogen-containing gas to provide a process having high selectivity with respect to the silicide surface to achieve significant process overetch without erosion of the silicide layer. In the practice of the present invention, overetch may occur in an amount of from about 30% to 150% of the time required for the etch process.

In a preferred embodiment, the etch process of the invention is carried out at a pressure of from about 100 to about 300 millitorr, typically about 150 millitorr, using a plasma generated by a capacitive discharge (parallel plate) type plasma reactor. The capacitive discharge process may be carried out using magnetic enhancement. The etch process can also be carried out in other types of plasma reactors, including inductively coupled ECR (electron cyclotron resonance) or a reactor downstream from the plasma source.

A silicon dioxide ($SiO_2$) etch process of the invention exhibits high selectivity with respect to a metallic silicide of a level of overetch in the process of at least 150% without causing undesirable etching of the silicide, regardless of the type of plasma generator utilized, or the pressure utilized within the broad range of from about 5 to about 400 millitorr.

The addition of a nitrogen-containing gas to the etching process of the present invention improves selectivity of the insulating layer with respect to the silicide layer in a simple and inexpensive manner without interruption of process throughput. Exemplary silicide layers operable in the practice of the present invention include silicides of refractory metals such as, molybdenum, cobalt, titanium, tungsten or tantalum.

The one or more fluorine-containing etchant gases may be any fluorine containing etchant gas such as an organic fluorocarbon gas such as $CHF_3$ or $CF_4$ or a higher fluorocarbon and mixtures thereof. The nitrogen-containing gas operable within the instant process may be any plasma etch nitrogen containing gas such as $N_2O$, $NO$, $NO_2$, $N_2H_4$, $NH_3$, nitrogen gas, $N_2$, and mixtures thereof.

BRIEF DESCRIPTION OF THE DRAWINGS

The present invention will be described with reference to the drawings of the following figures.

DESCRIPTION OF THE PREFERRED EMBODIMENTS

Figure 1A:
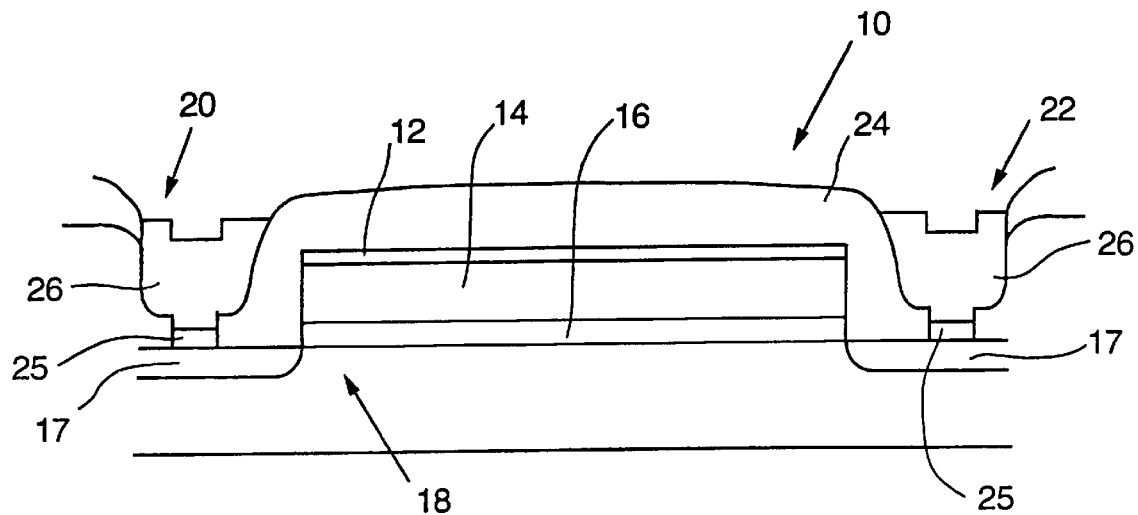
FIGS. 1a and 1b illustrate prior art polycide and salicide structures including contact stop layers.
Figure 1B:
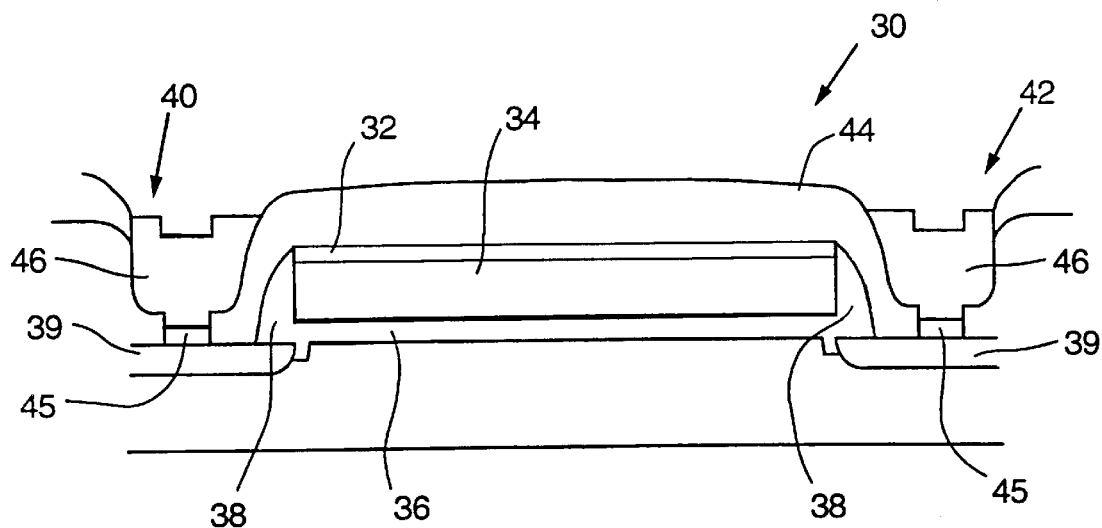
Figure 2:
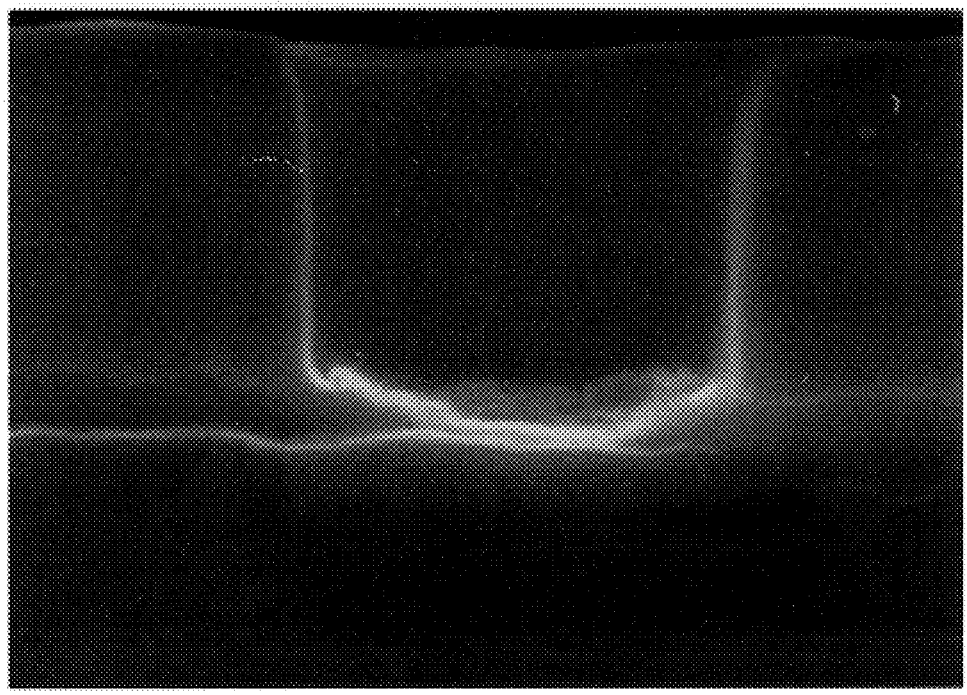
FIG. 2 is an SEM photograph illustrating titanium silicide punch through using a $CHF_3/CF_4$ etch chemistry.
Figure 2:

The present invention is directed to an improved process for etching contact openings in an insulation layer, such as $SiO_2$, formed on a silicide layer to effect a high selectivity with respect to the silicide; that is, there is a very high ratio of the etch rate of the oxide to that of the silicide. The etch process of the invention comprises a highly selective plasma etch for the plasma etching of an insulating material, such as an oxide over a silicide surface on an integrated circuit structure in an etch chamber using one or more fluorine-containing etchant gases and a nonreactive nitrogen containing gas. The instant process can be performed with an overetch step of at least 150% without etching or eroding the silicide layer.

The one or more fluorine-containing etchant gases used in the process of the invention in combination with a nitrogen-containing gas will, of course, be understood to mean a fluorine-containing etchant gas (or gases). Such fluorine-containing etchant gases may comprise one or more 1–2 carbon fluorine-containing hydrocarbon gases such as, for example, $CF_4$, $CHF_3$, $CH_2F_2$, $CH_3F$, $C_2F_6$, and mixtures of same. Other inorganic fluorine-containing etchant gases such as $SF_6$ also may be used, as well as organic fluorine-containing etchant gases with 1–2 carbon fluorine-containing hydrocarbon etching gases and mixtures thereof. In the case of nitrogen-containing etchant gases, they are not considered a "nitrogen-containing gas" within the purview of the present invention because they would add to the etchant activity and significantly modify the original recipe programmed process.

The one or more fluorine-containing etchant gases used in combination with a nonreactive nitrogen containing gas in the practice of the process of the invention may also comprise one or more higher molecular weight fluorinated hydrocarbons. Higher weight fluorinated hydrocarbons are defined as 3–6 carbon fluorinated hydrocarbon compounds having the general formula $C_xH_yF_z$, wherein x is 3 to 6, y is 0 to 3, and z is 2x-y (for cyclic compounds) or 2x-y+2 (for noncyclic compounds). Such 3–6 carbon fluorinated hydrocarbons comprise an organic molecule containing: either carbon and fluorine; or carbon, fluorine, and hydrogen; and which may be either cyclic or noncyclic, but not aromatic.

Examples of cyclic 3–6 carbon fluorinated hydrocarbon compounds which may be included in the above formula are: $C_3H_3F_3$, $C-,H_2F_4$, $C_3HF_5$, $C_3F_6$, $C_4H_3F_6$, $C_4H_2F_6$, $C_4HF_7$, $C_4F_8$, $C_5H_3F_7$, $C_5H_2F_8$, $C_5HF_9$, $C_5F_{10}$, $C_6H_3F_9$, $C_6H_2F_{10}$, $C_4HF_{11}$, and $C_6F_{12}$. Examples of noncyclic 3–6 carbon fluorinated hydrocarbons compounds which may be included in the above formula are: $C_3H_3F_5$, $C_3H_2F_6$, $C_3HF_7$, $C_3F_8$, $C_4H_3F_7$, $C_4H_2F_8$, $C_4HF_9$, $C_4F_{10}$, $C_5H_3F_9$, $C_5H_2F_{10}$, $C_5HF_{11}$, $C_5F_{12}$, $C_6H_3F_{11}$, $C_6H_2F_{12}$, $C_4HF_3$, and $C_6F_{14}$. Preferred among the above 3–6 carbon fluorinated hydrocarbon compounds is cyclooctofluorobutane ($C_4F_8$). Any of these higher-weight fluorinated hydrocarbon etchant gases may be used alone or in combination with any of the other previously discussed fluorine-containing etchant gases in the practice of the present invention.

Generally, to carry out an etching process according to the present invention, a gas mixture is introduced into an etching chamber in which an integrated circuit structure or other workpiece is enclosed. The gas mixture contains an etchant that, under the selected process conditions, attacks exposed portions of the insulation layer to form openings to be filled subsequently with a conductive material to form the contacts themselves.

While not wishing to be bound by any theory of operation, it is believed that the addition of a nitrogen-containing gas, such as $N_2$, to the gaseous etching mixture assists in achieving formation of inorganic nitrides (e.g., TiN) with the metallic silicide composition. The formation of these nitrides renders the silicide layer less sensitive and substantially decreases the silicide layer's normal rate of etch for an untreated surface.

The nitrogen-containing gas of the present invention should be added prior to reaching the silicide layer. As such, the nitrogen-containing gas may be added before, during or after the introduction of the etchant gas into the etching chamber. Thus, the process of the present invention may be carried out as a one- or two-step process.

The term "insulation layer" as used herein refers to any nonconductive material used to electrically isolate a layer from other conductive materials. An insulation material may be silicon oxide, such as deposited from a plasma-excited mixture of tetraethylorthosilicate (TEOS) and $O_2$, or a doped silicon oxide such as, for example, a phosphorous-doped or borophosphorous-doped silicon oxide. The insulation material may also be, for example, silicon nitride or silicon oxynitride.

The term "silicide" as used herein refers to a compound such as a refractory metal silicide. Exemplary silicides include titanium silicide, tantalum silicide, tungsten silicide, molybdenum silicide and cobalt silicide. In the context of dry etch processes, at least, the silicides referred to in the present invention are different in nature and intended to be distinguished from metals, such as pure aluminum and its alloys, and other materials selected for use as an interconnect material in integrated circuits.

The phrase "nitrogen-containing gas" as used herein refers to any nitrogenous gas, such as nitrogen gas, $N_2$, and also other nitrogen-containing gases such as $N_2O$, NO, $NO_2$, $NH_3$, and $N_2H_4$. These nitrogenous gases within the purview of the present invention are those which do not modify the originally programmed etching process: that is, the reactive species generated from the decomposition of such a nitrogen-containing gas in the plasma does not add to, modify, or alter the originally programmed etching process. As such, the nitrogen-containing gases of the present invention are "nondisruptive" of the original etch process and recipe contemplated.

The amount of nitrogen-containing gas, such as $N_2$, used in the etch chamber should range from about 2 to about 30 volume percent of the total amount of fluorine-containing etchant gas (or gases) used. Preferably, the amount of nitrogen-containing gas should be in a range of about 5% to 25% by volume. Thus, for example, when one or more fluorine-containing etchant gases are flowed into a 9 liter etch chamber at a flow rate of from about 20 standard cubic centimeters per minute (sccm) to about 60 sccm, the flow rate of $N_2$ will range of from about 1 sccm (5 volume % of 20 sccm) to about 15 sccm (25 volume % of 60 sccm). When a larger or smaller etch chamber is used, the flow rates may need to be respectively adjusted either upwardly or downwardly, but the ratio of $N_2$ gas (the nonreactive nitrogen-containing gas) to the total of the one or more fluorine-containing etchant gases used in the process will remain the same.

And further, the amount of the nitrogen-containing gas added to the etchant should be such that the nitrogen-containing gas does not significantly modify the etching process, but contributes to a dramatically improved selectivity with respect to the underlying silicide layer. The specific amount nitrogen-containing gas used may vary depending upon the silicide stop. Generally, the nitrogen-containing gas may be added in volume amounts of from about 2% to 30% of the total gas mixture. For example, for a titanium silicide stop, an adequate amount of added $N_2$ to improve selectivity is between about 5 v % to about 25 v % of a gaseous etchant, such as a mixture of $CHF_3$ and $CF_4$. However, the amount of the nitrogen-containing gas added can be as little as 2 or 3 v % depending on the nature of the metallic silicide.

As noted above, a suitable amount of nitrogen-containing gas added may vary depending on the specific goals of the process with respect to etch rate, desired contact profile, and selectivity requirements. In addition, practical limitations in mass flow meters or other equipment delivering controlled and very small amounts (even less than 2 v %) of a nitrogen-containing gas may need to be addressed.

The mixture of the nitrogen-containing gas (e.g., $N_2$) and one or more fluorine-containing etch gases may be used alone in the etch chamber or may be further diluted using one or more inert gases, such as helium or argon. Such inert gases may be flowed into the etch chamber at a rate of 0 to about 200 sccm. In some instances, other nonreactive gas or gases may also be used with the mixture of the nitrogen containing gas and one or more fluorine-containing etch gases (with or without inert gases).

The plasma etch process of the invention using a combination of a nitrogen containing gas and one or more fluorine-containing etch gases (with or without other gases) may be used in combination with a conventional capacitive discharge (parallel plate) plasma reactor or with an inductively coupled plasma reactor. The plasma associated with the etch chamber during the etch process of the invention may comprise a plasma generated within the etch chamber, or generated external to the etch chamber itself, wherein the plasma flows to the chamber downstream from the plasma source.

The total amount of etchant gas that is flowed into the etching chamber will vary somewhat depending upon the size of the chamber and the size of the wafer. Typically, for an etching chamber of about 13 liters, such as that utilized in the Applied Materials Precision 5000, MERIE Reactor or Centura High Density Plasma Dielectric Etch System, the total gas flow may suitably be between about 20 sccm and about 500 sccm, and preferably remains below about 200 sccm. For other etching chambers, the gas flow rate may be adjusted as needed.

The pressure in the etching chamber should be sufficient to maintain the etching process. The pressure used during the etch process of the invention may vary from as little as 5 millitorr to as high as 400 millitorr; and, typically, the pressure is maintained at about 150 millitorr during the etching step. Higher pressures can be used up to, for example, about 1–2 torr, provided that arcing does not occur between the electrodes in the etching chamber. It will be noted, however, that it may be difficult to use a pressure below about 50 millitorr when using a capacitive plate-type plasma generator because of the inability of such a plasma generator to ignite or sustain a plasma in a pressure below about 50 mTorr. Therefore, preferably the pressure is maintained within a range of from about 50 millitorr to about 200 millitorr when using a capacitive discharge-type plasma generator in the practice of the process of the invention.

The power level of the plasma may vary from about 300 watts (W) to about 5 kilowatts (kw), depending upon the particular type of plasma generator, size of chamber and wafer, desired etch rate, etc. For example, using an ECR-type electromagnetically coupled plasma generator in association with an etch chamber of about 6 liters and a desired etch rate of about 5000 angstroms per minute, the power would typically range from about 2 to about 3 kw. For an inductive-type electromagnetically coupled plasma generator used in association with a 2 liter etch chamber and a desired etch rate of about 5000 angstroms per minute, the power would typically range from about 1 to about 2 kw. When a high-density plasma is to be generated, the power density (i.e., the power level relative to the volume of the plasma generating chamber) should be equivalent to a power level of about 1000 watts in a 4 liter plasma-generating chamber.

For a 6 inch wafer, the power typically is between about 500 W and about 700 W. By use of the expression "associated with the etch chamber" with respect to the plasma, it is meant that the plasma may be generated either within the etching chamber itself or outside of the etching chamber, at some point in communication with the etching chamber. For example, a plasma may be generated in a microwave cavity in a gas flow upstream of the etching chamber so that the plasma-generated reactive species flow into the etching chamber.

The instant etch process may be practiced in the form of reactive ion etching (RIE). The plasma etch process of the present invention may also be carried out with or without magnetic enhancement, as described in U.S. Pat. No. 4,668,338, issued to Maydan et al., assigned to the assignee of the present invention. When such magnetic enhancement is used, the wafer may be immersed in the etching chamber in a magnetic field having a component between about 1 gauss and 150 gauss parallel the plane of the wafer.

To further illustrate the process of the present invention the following nonlimiting examples are provided.

Test Wafers

The silicon test wafers (150 mm diameter) had a film stack of 0.8–1.2 $\mu$m thick undoped or doped silicon oxide, formed by a conventional TEOS/$O_2$ deposition process on about 500–1000 Å thick titanium silicide over polysilicon. A photoresist mask applied to the test wafers provided a contact opening pattern with opening dimensions of $\leq 0.5$ $\mu$m diameter.

EXAMPLE I

Two Step Process

Contacts were etched into a 0.9 $\mu$m PTEOS oxide layer over 750 Å $TiSi_2$ In the first step, a gas mixture of 25 sccm $CHF_3$, 5 sccm $CF_4$ and 75 sccm Ar was flowed into the etching chamber to about 120 millitorr pressure. A plasma was ignited and maintained over the test wafer placed in an Applied Materials 5000 MERIE reactor chamber by applying about 750 W power (RF) and using magnetic field enhancement at about 60 gauss. The cathode temperature was set at 20° C. and helium backside cooling pressure at 8 torr. Etching was continued to endpoint as determined by monitoring the 4835 Å CO optical emission line intensity (which decreased at endpoint (etch time=108 s).

At the endpoint, the second step, referred to as overetch, was initiated, during which 10 sccm $N_2$ was added to $CHF_3$(35 sccm)/$CF_4$(5 sccm)/Ar(60 sccm) etchant gas mixture (20 v % $N_2$) for a total pressure of about 150 millitorr. Plasma enhancement was maintained by applying about 700 WV and 60 gauss magnetic field enhancement. Overetch was continued until the etch time corresponded to about 55% overetch (58 s).

The wafer was then removed from the etching chamber and the photoresist mask removed by downstream oxygen plasma ash process (120 s at 250° C.) in a Gasonics Aura 1000 system.

Figure 3A:
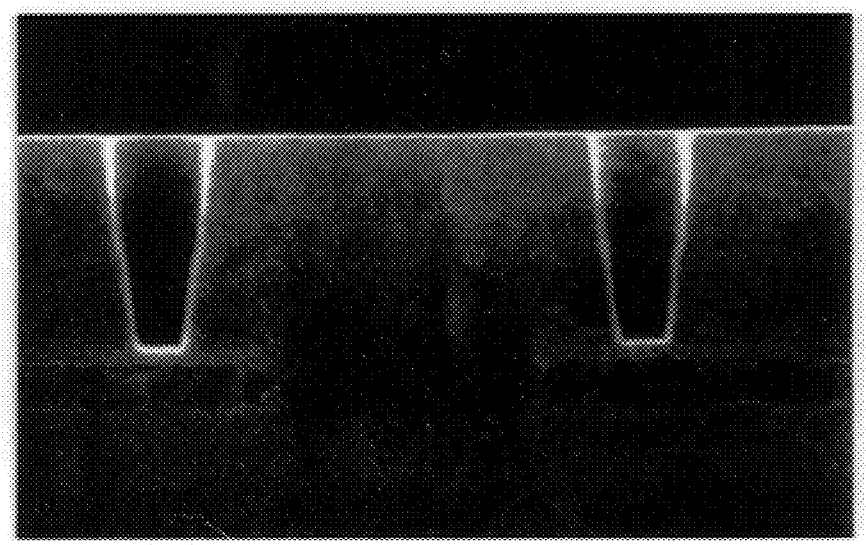
FIGS. 3a and 3b are SEM photographs of center and edge views, respectively, of a contact opening etched in an oxide layer using a two-step process according to the present invention.
Figure 3B:
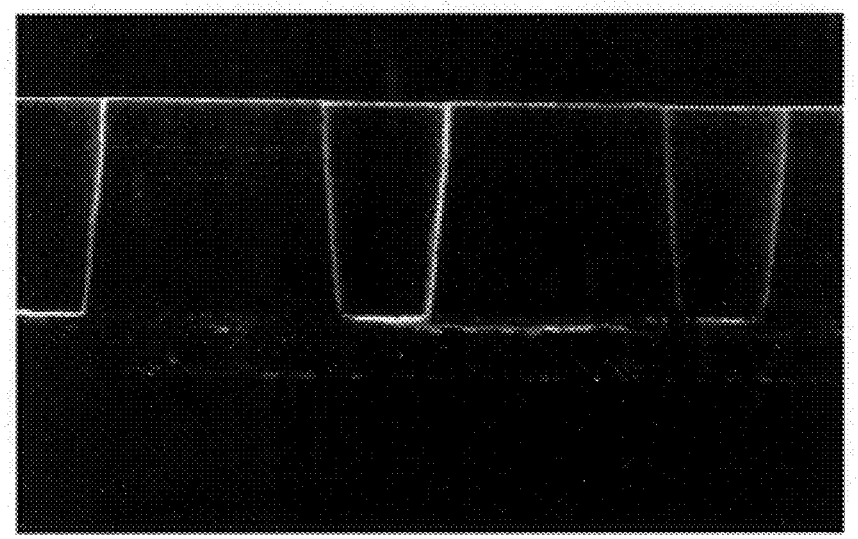
Figure 4:
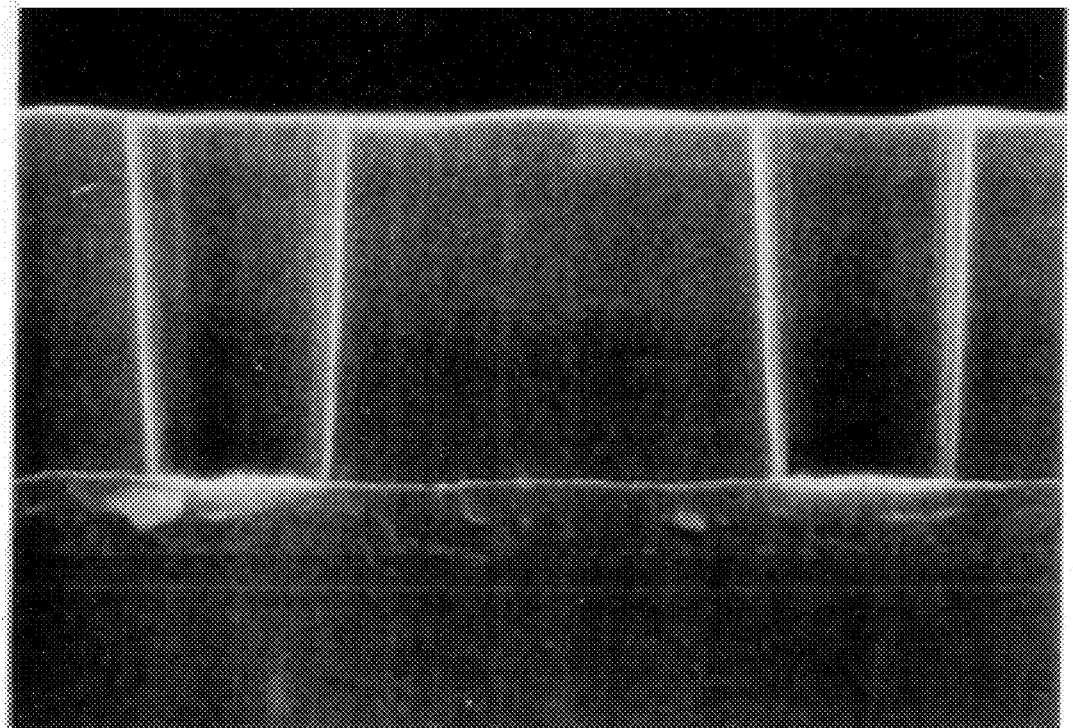
FIG. 4 is a SEM photograph of a contact opening etched in an oxide layer with 30% overetch using a one-step process according to the present invention.
Figure 5A:
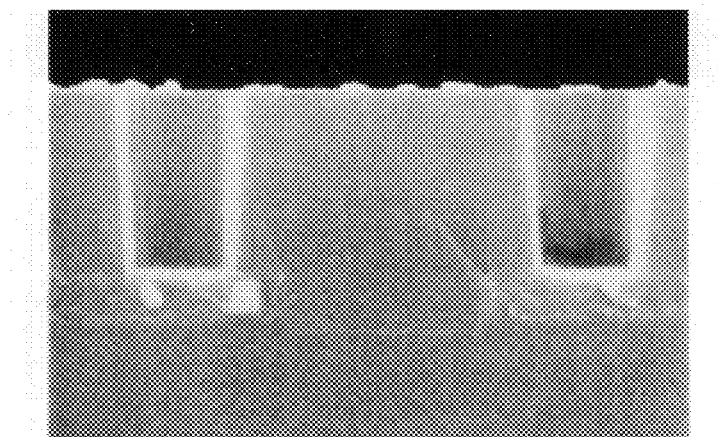
FIG. 5 is a SEM photograph of a contact opening in an oxide layer etched with 55% overetch using a one-step process according to the present invention.
Figure 5B:
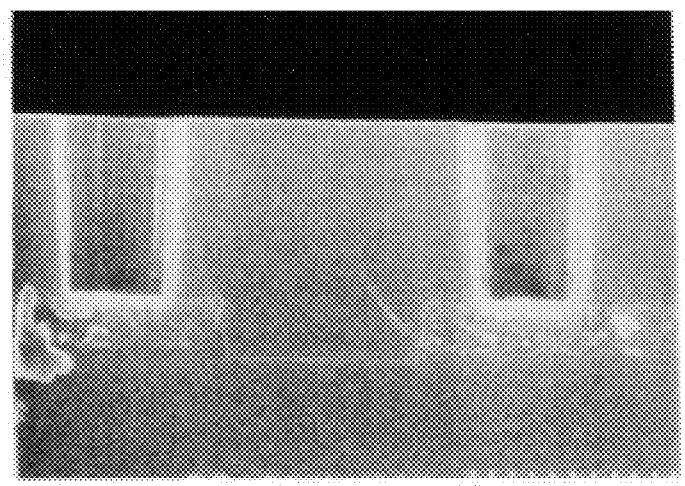
Figure 6A:
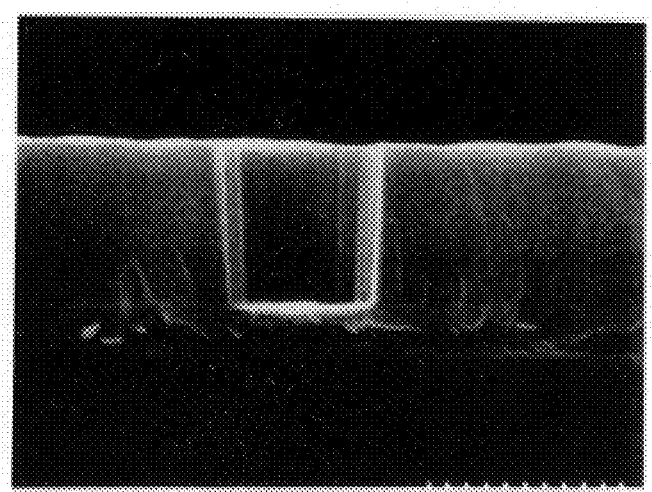
FIGS. 6a and 6b are SEM photographs of center and edge views, respectively, of a contact opening in an oxide layer with 100% overetch using a one-step process according to the present invention.
Figure 6B:
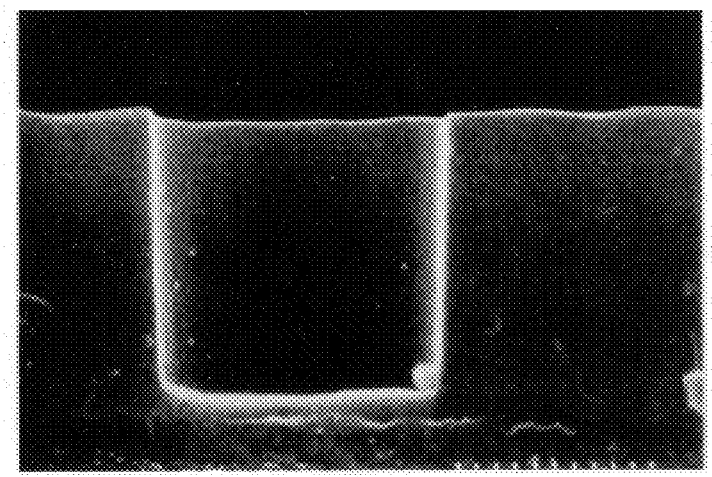
Figure 7A:
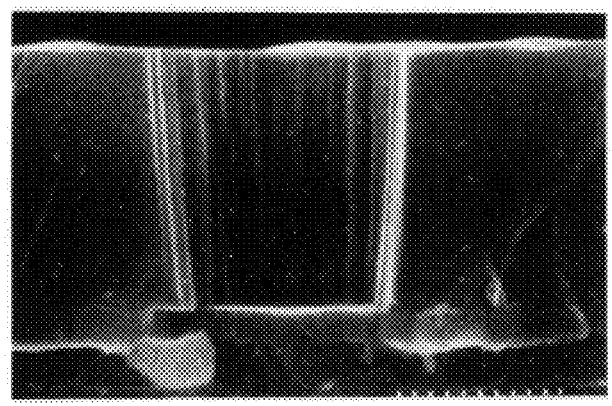
FIGS. 7a, 7b, 7c, 7d and 7e are SEM photographs of top, bottom, center, right and left views, respectively, of a contact opening in an oxide layer with 150% overetch using a one-step process according to the present invention.
Figure 7B:
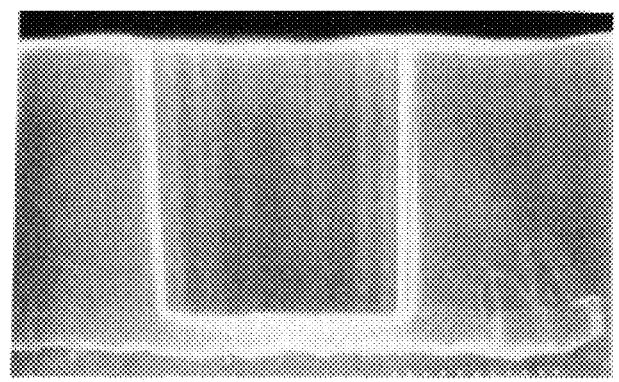
Figure 7C:
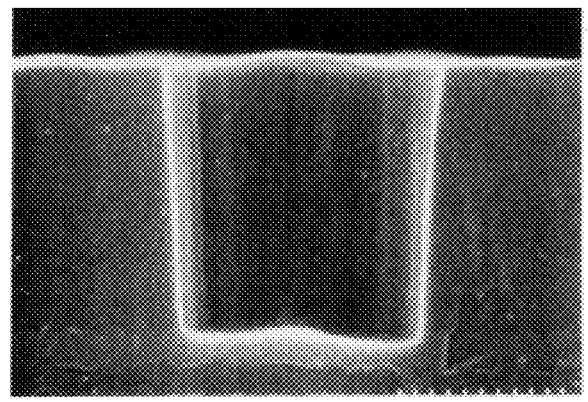
Figure 7D:
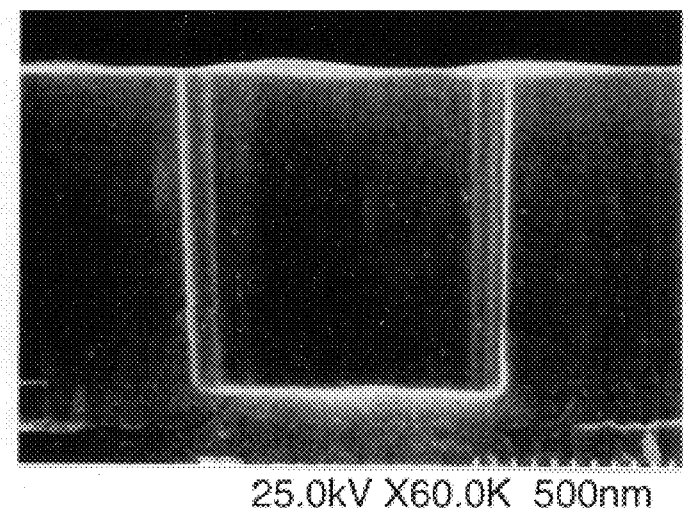
Figure 7E:
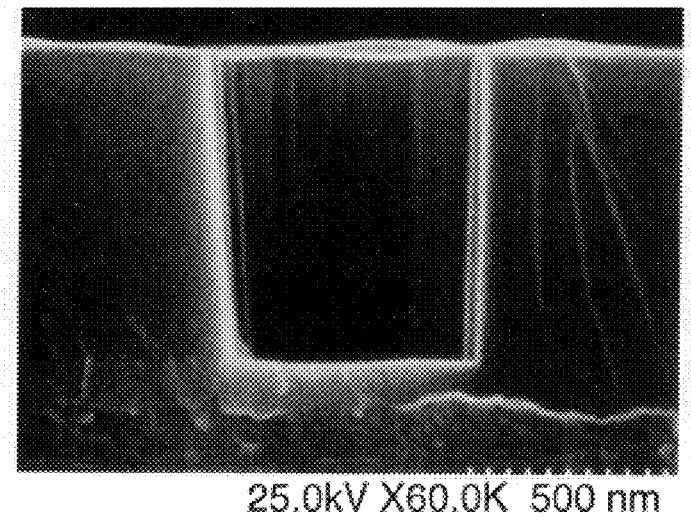

The SEM cross-section of the test wafer (FIG. 3) shows a successful etch stop on the $TiSi_2$ layer with substantially no $TiSi_2$ loss at the bottom of 0.5 $\mu$m contact holes, even with 55% overetch.

EXAMPLES II–V

One Step Process With Varying Overetch

For added simplicity, a single-step etch process may be preferred over a two-step recipe. Contacts were etched into 0.9 $\mu$m TEOS layer using a single step process.

Test wafers were plasma etched in an etchant gas mixture of about 25 sccm $CHF_3$, 5 sccm $CF_4$, 100 sccm Ar and 10 sccm $N_2$ (25 veto $N_2$) at 100 millitorr pressure. The applied power was about 750 W and magnetic enhancement was about 30 gauss. The cathode temperature was increased to 40° C. while holding the helium backside cooling pressure at 8 torr to minimize the center to edge profile angle differences. The etch time to clear the oxide layer to $TiSi_2$ was calculated based on a predetermined patterned TEOS etch rate (~3300 Å/min). Four wafers were then etched, each with a different overetch time of 30%, 55%, 100% and 150%, respectively, to demonstrate the effectiveness of the oxide etch process for stopping on a $TiSi_2$ layer. After the single step etch, the wafers were removed from the etch chamber and the photoresist mask ashed away using downstream oxygen plasma as described in Example I.

SEM cross-sections of these test wafers after etching tinder the given process parameters are shown in FIGS. 4–7, respectively. As can be seen, processes according to the present invention exhibit an excellent ability to stop on a $TiSi_2$ layer even at 150% overetch with minimal, if any, $TiSi_2$ loss. Punch through was avoided in each instance.

Based on the SEM cross-sections a maximum $TiSi_2$ layer loss of <200 Å at 150% overetch is estimated, a result that is particularly important for bilevel contact etch applications.

Having thus described several particular embodiments of the invention, various alterations, modifications and improvements will readily occur to those of ordinary skill in the art. Accordingly, the foregoing description is by way of example only and not limiting. The invention is limited only as defined in the following claims and equivalents thereto.

I claim:

1. A plasma etch process for selectively etching an insulation layer overlaying a silicide surface of an integrated circuit structure on a semiconductor workpiece at a temperature at least about 0 degrees C., the process comprising: flowing into an etch chamber containing said workpiece, a mixture of one or more fluorine-containing etch gases and a nitrogen-containing gas while simultaneously maintaining a plasma associated with said etch chamber, at a pressure of less than or equal to about 700 millitorr, wherein the nitrogen-containing gas ranges from about 2 to about 30 volume % of the total amount of fluorine-containing etchant gas flowing into said etch chamber.

2. The process of claim 1 wherein said process is carried out on a silicon dioxide ($SiO_2$) insulating layer in said etch chamber.

3. The process of claim 1 wherein one or more inert gases are also flowed into said etch chamber during the process.

4. The process of claim 1 wherein the pressure in said chamber ranges from about 5 millitorr to about 400 millitorr.

5. The process of claim 4 wherein said plasma associated with said etch chamber is generated by an inductively coupled plasma generator.

6. The process of claim 5 wherein said pressure in said chamber is maintained below 50 millitorr.

7. The process of claim 4 wherein said pressure in said etch chamber is maintained in a range of from about 50 millitorr to about 200 millitorr.

8. The process of claim 7 wherein said pressure in said chamber is maintained at about 150 millitorr.

9. The process of claim 7 wherein said plasma associated with said etch chamber is generated by a capacitive discharge type plasma generator.

10. The process of claim 3 wherein said one or more fluorine-containing etch gases are organic fluorocarbons selected from the group consisting of $CF_4$, $CHF_3$, $CH_2F_2$, $CH_3F$, $C_2F_6$, $C_4F_8$ and mixtures thereof.

11. The process of claim 10 wherein said one or more fluorine-containing etch gases are selected from the group consisting of $CF_4$ and $CHF_3$.

12. The process of claim 10 wherein the nitrogen-containing gas is selected from the group consisting of $N_2$, $N_2O$, $NO$, $NO_2$, $NH_3$, $N_2H_4$, and mixtures thereof.

13. The process of claim 3 wherein said one or more fluorine-containing gases comprise one or more 3–6 carbon fluorinated hydrocarbons having the formula $C_xH_yF_z$, wherein x is 3 to 6, y is 0 to 3, z is 2x–y when said fluorinated hydrocarbon is cyclic, and z is 2x–y+2 when said fluorinated hydrocarbon is noncyclic.

14. The process of claim 2 wherein said silicide surface is a refractory metal silicide.

15. The process of claim 14 wherein the refractory metal is selected from the group consisting of molybdenum, cobalt, titanium, tantalum, and tungsten.

16. The process of claim 1 wherein the power level of said plasma ranges from about 300 watts to about 5 kw.

17. A plasma etch process for selectively etching a dielectric on a silicide surface of an integrated circuit structure on a semiconductor workpiece, the process comprising:
a) maintaining an etch chamber containing said workpiece at a pressure of from about 1 millitorr to about 200 millitorr;
b) flowing into said chamber a mixture of a nitrogen-containing gas and one or more fluorine-containing etch gases, in a ratio of about 10 volume % to 30 volume % nitrogen-containing gas of the volume of said one or more fluorine-containing etch gases;
c) maintaining a plasma associated with said etch chamber within a power level ranging from about 300 watts to about 5 kw; and
d) selectively etching said dielectric without etching said silicide.

18. The process of claim 17 wherein said plasma associated with said etch chamber is generated by an electromagnetically coupled plasma generator.

19. The process of claim 18 wherein said pressure in said chamber is maintained at below about 50 millitorr.

20. The process of claim 17 wherein said pressure in said chamber is maintained within a range of from about 50 millitorr to about 200 millitorr and said plasma associated with said etch chamber is generated by a capacitive discharge-type plasma generator.

21. The process of claim 17 wherein said one or more fluorine-containing etch gases are selected from the group consisting of $CF_4$, $CHF_3$, $CH_2F_2$, $CH_3F$, $C_2F_6$, $SF_6$, $C_4F_8$, and mixtures thereof.

22. The process of claim 17 wherein said one or more fluorine-containing gases comprise one or more 3–6 carbon fluorinated hydrocarbons having the formula $C_xH_yF_z$, wherein x is 3 to 6, y is 0 to 3, z is 2x–y when said fluorinated hydrocarbon is cyclic, and z is 2x–y+2 when said fluorinated hydrocarbon is noncyclic.

23. The process of claim 17 wherein one or more inert gases are also flowed into said etch chamber during said process.

24. The process of claim 17 further comprising the step of:
d) over-etching said dielectric with the plasma for a selected time while maintaining selectivity of said oxide with respect to the silicide layer.

25. A plasma etch method for etching a dielectric on a silicide surface of an integrated circuit structure on a semiconductor workpiece, the method comprising:
(a) maintaining an etch chamber containing said workpiece at a pressure from about 30 millitorr to about 200 millitorr;
(b) flowing into said chamber a mixture of nitrogen-containing gas and one or more fluorine-containing etch gases, wherein the nitrogen-containing gas ranges from about 2 volume % to about 30 volume % of the total amount of said one or more fluorine-containing etch gases flowing into said etch chamber;
(c) generating a plasma associated with said etch chamber using an inductively coupled plasma generator maintained within a power level ranging from about 300 watts to about 5 kw; and
(d) selectively etching said dielectric without etching said silicide.

26. A method according to claim 25, wherein the amount of nitrogen-containing gas added is between about 5 v % to about 25 v % of the fluorine-containing etch gas.

27. A method according to claim 25, wherein the etching step is carried out with magnetic enhancement.

28. A method according to claim 25, wherein the nitrogen-containing gas is selected from the group consisting of $N_2$, $N_2O$, $NO$, $NO_2$, $NH_3$, $N_2H_4$, and mixtures thereof.

29. A method according to claim 25, wherein the etching is reactive ion etching.

30. A method according to claim 25, wherein the silicide layer comprises a silicide of molybdenum, cobalt, titanium, tantalum or tungsten.

31. A method according to claim 25, further comprising the steps of:
d) over-etching said dielectric with the plasma for at least 150% of the etch time while maintaining selectivity of said oxide with respect to the silicide layer.

32. A plasma etch process according to claim 1, wherein said temperature is between about 0 degrees C. and about 40 degrees C.

33. A plasma etch process according to claim 32, wherein said temperature is between about 10 degrees C. and about 40 degrees C.

* * * * *